United States Patent
Kuo et al.

(10) Patent No.: US 8,772,644 B2
(45) Date of Patent: Jul. 8, 2014

(54) CARRIER WITH THREE-DIMENSIONAL CAPACITOR

(71) Applicant: Chipbond Technology Corporation, Hsinchu (TW)

(72) Inventors: Chih-Ming Kuo, Hsinchu County (TW); Lung-Hua Ho, Hsinchu (TW); You-Ming Hsu, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 174 days.

(21) Appl. No.: 13/644,709

(22) Filed: Oct. 4, 2012

(65) Prior Publication Data
US 2014/0008111 A1    Jan. 9, 2014

(30) Foreign Application Priority Data
Jul. 9, 2012    (TW) ............................. 101124670 A

(51) Int. Cl.
*H05K 1/16*    (2006.01)
(52) U.S. Cl.
USPC .......................................... 174/260; 361/761
(58) Field of Classification Search
USPC ................... 174/260; 361/761–764
See application file for complete search history.

(56) References Cited

U.S. PATENT DOCUMENTS

| | | | | |
|---|---|---|---|---|
| 6,876,554 | B1 * | 4/2005 | Inagaki et al. | 361/763 |
| 8,492,658 | B2 * | 7/2013 | Gruendler et al. | 174/262 |
| 8,654,539 | B2 * | 2/2014 | Nakanishi | 361/763 |

* cited by examiner

*Primary Examiner* — Jeremy C Norris
(74) *Attorney, Agent, or Firm* — Jackson IPG PLLC

(57) ABSTRACT

A carrier with three-dimensional capacitor includes a substrate and a three-dimensional capacitor, wherein the substrate comprises a trace layer having a first terminal and a second terminal. The three-dimensional capacitor is integrally formed as one piece with the trace layer. The three-dimensional capacitor and the trace layer are made of same material. The three-dimensional capacitor comprises a first capacitance portion and a second capacitance portion, the first capacitance portion comprises a first section, a second section and a first passage, the second capacitance portion is formed at the first passage. The second capacitance portion comprises a third section, a fourth section and a second passage communicated with the first passage. The first capacitance portion is located at the second passage, a first end of the first capacitance portion connects to the first terminal, and a third end of the second capacitance portion connects to the second terminal.

13 Claims, 4 Drawing Sheets

CARRIER WITH THREE-DIMENSIONAL CAPACITOR

FIELD OF THE INVENTION

The present invention is generally related to a carrier, which particularly relates to the carrier with three-dimensional capacitor

BACKGROUND OF THE INVENTION

A conventional capacitor is made to become a single package device in advance. Thereafter, soldering said packaged capacitor onto a printed circuit board (PCB) by using surface mounting technology (SMT). Or, connecting said packaged capacitor to interior traces of the flexible print board (FPC) by utilizing flip-chip bonding technology. With the breakthrough of integrated circuit process development, various kinds of electronic devices trend toward features of high density, high operation speed and miniaturization. Therefore, specific manufacturing method and installation manner for conventional capacitor require a relative lagging process and a larger space, which does not meet present requirement.

SUMMARY

The primary object of the present invention is to provide a carrier with three-dimensional capacitor including a substrate and at least one three-dimensional capacitor, wherein the substrate comprises a surface and at least one trace layer formed on the surface. The trace layer comprises at least one first terminal and at least one second terminal. The three-dimensional capacitor is integrally formed as one piece with the trace layer, wherein the three-dimensional capacitor and the trace layer are made of a same material. The three-dimensional capacitor comprises a first capacitance portion and a second capacitance portion having a polarity opposite to a polarity of the first capacitance portion, wherein the first capacitance portion comprises a first end, a second end, at least one first section, at least one second section connected to the first section and at least one first passage located between the first section and the second section. The second capacitance portion is formed at the first passage and comprises a third end, a fourth end, at least one third section, at least one fourth section connected to the third section and at least one second passage located between the third section and the fourth section. The second passage is in communication with the first passage, the first capacitance portion is located at the second passage, the first end corresponds to the third end and connects to the first terminal, the third end connects to the second terminal, wherein the first section and the third section are spaced apart from each other to define a first spacing, the third section and the second section are spaced apart from each other to define a second spacing, the fourth section and the second section are spaced apart from each other to define a third spacing. Accordingly, the three-dimensional capacitor possesses features of thinner and lighter owning to the reason that the three-dimensional capacitor is integrally formed as one piece with the trace layer. In addition, the step of soldering the capacitor onto the carrier can be ignored thereby simplifying the manufacturing process.

DETAILED DESCRIPTION OF THE INVENTION

Figure 1:
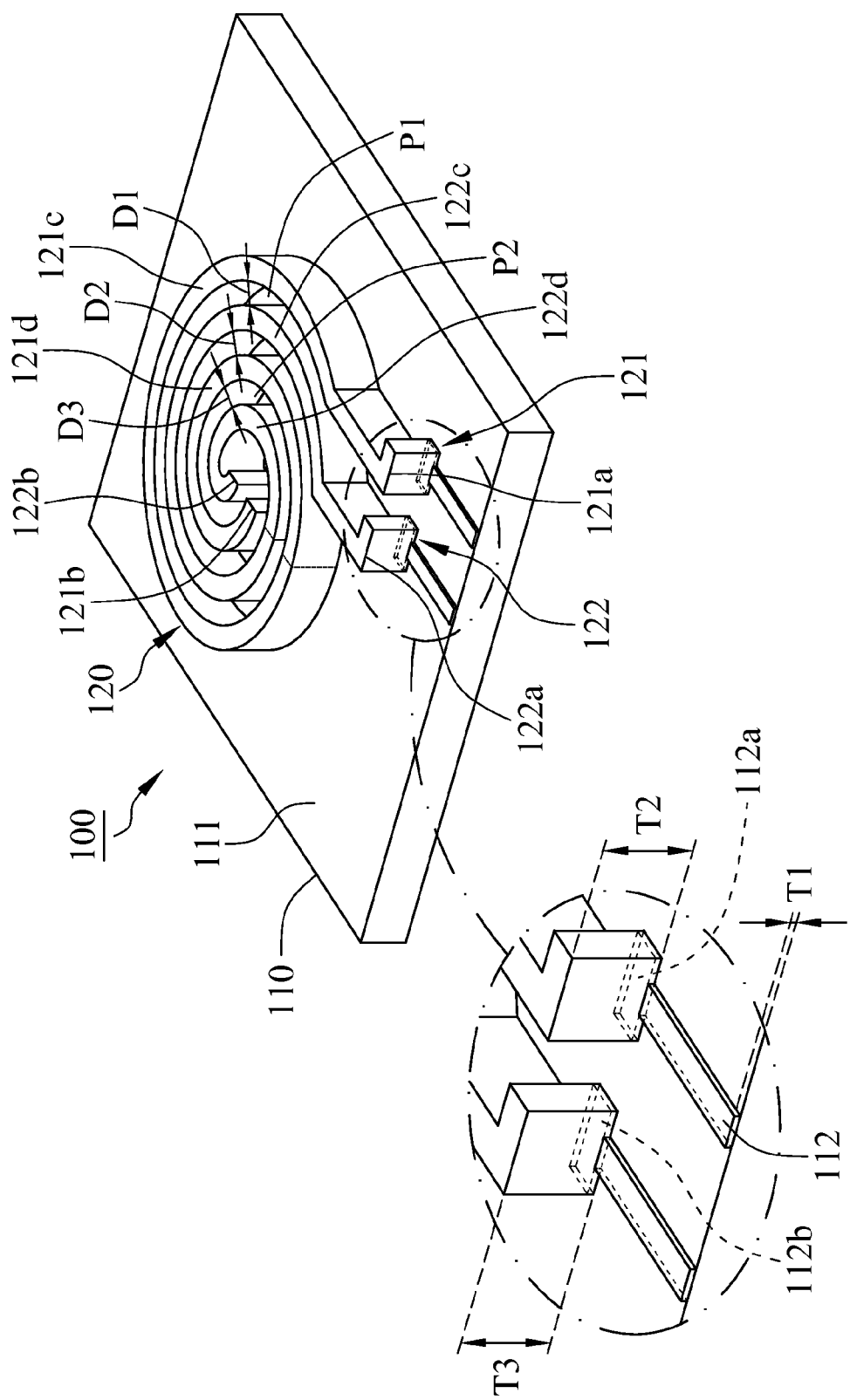
FIG. 1 is a perspective diagram illustrating a carrier with three-dimensional capacitor in accordance with a first embodiment of the present invention.

With reference to FIG. 1, a carrier with three-dimensional capacitor 100 in accordance with a first embodiment of the present invention includes a substrate 110 and at least one three-dimensional capacitor 120. The substrate 110 comprises a surface 111 and at least one trace layer 112 formed on the surface 111, and the trace layer 112 comprises at least one first terminal 112a and at least one second terminal 112b. In this embodiment, the material of the trace layer 112 is copper. The three-dimensional capacitor 120 is integrally formed as one piece with the trace layer 112. Besides, the three-dimensional capacitor 120 and the trace layer 112 are made of a same material. The three-dimensional capacitor 120 comprises a first capacitance portion 121 and a second capacitance portion 122 having a polarity opposite to a polarity of the first capacitance portion 121. The three-dimensional capacitor 120 is spiral-shaped. In this embodiment, the trace layer 112 comprises a first thickness T1, the first capacitance portion 121 comprises a second thickness T2, the second capacitance portion 122 comprises a third thickness T3, wherein the second thickness T2 and the third thickness T3 are not smaller than the first thickness T1. The second thickness T2 and the third thickness T3 are equal to the first thickness T1 while the manufacturing process is a single-layered photoresist process. The second thickness T2 and the third thickness T3 are larger than the first thickness T1 while the manufacturing process is a two-layered photoresist process. In this embodiment, the second thickness T2 and the third thickness T3 are larger than the first thickness T1. Preferably, the second thickness T2 is the same as the third thickness T3. With reference to FIG. 1 again, the first capacitance portion 121 comprises a first end 121a, a second end 121b, at least one first section 121c, at least one second section 121d connected to the first section 121c and at least one first passage P1 located between the first section 121c and the second section 121d. In this embodiment, the first end 121a is located at the first section 121c, and the second end 121b is located at the second section 121d. The second capacitance portion 122 is formed at the first passage P1 and comprises a third end 122a, a fourth end 122b, at least one third section 122c, at least one fourth section 122d connected to the first section 122c and at least one second passage P2 located between the third section 122c and the fourth section 122d. The second passage P2 is in communication with the first passage P1. The third end 122a is located at the third section 122c, and the fourth end 122b is located at the fourth section 122d. The first capacitance portion 121 is located at the second passage P2, the first end 121a corresponds to the third end 122a, the second end 121b corresponds to the fourth end 122b, the first end 121a is in connection with the first terminal 112a, and the third end 122a is in connection with the second terminal 112b. The first section 121c and the third section 122c are spaced apart from each other to define a first spacing D1, the third section 122c and the second section 121 d are spaced apart from each other to define a second spacing D2 equal to the first spacing D1, the fourth section 122d and the second section 121d are spaced apart from each other to define a third spacing D3 equal to the first spacing D1. Accordingly, the first spacing D1 and the second spacing D2 are the same as the third spacing D3. The three-dimensional capacitor 120 is composed of two adjacent metals with opposite polarity to each other and the air located between adjacent metals. Therefore, the three-dimensional capacitor 120 is also named as air capacitor with functions of filtering and electrical energy storage. Furthermore, the three-dimensional capacitor 120 possesses features of thinner and lighter owning to the reason that the three-dimensional capacitor 120 is integrally formed as one piece with the trace layer 112. In addition, the step of soldering the capacitor onto the carrier can be ignored thereby simplifying the manufacturing process.

Figure 2:
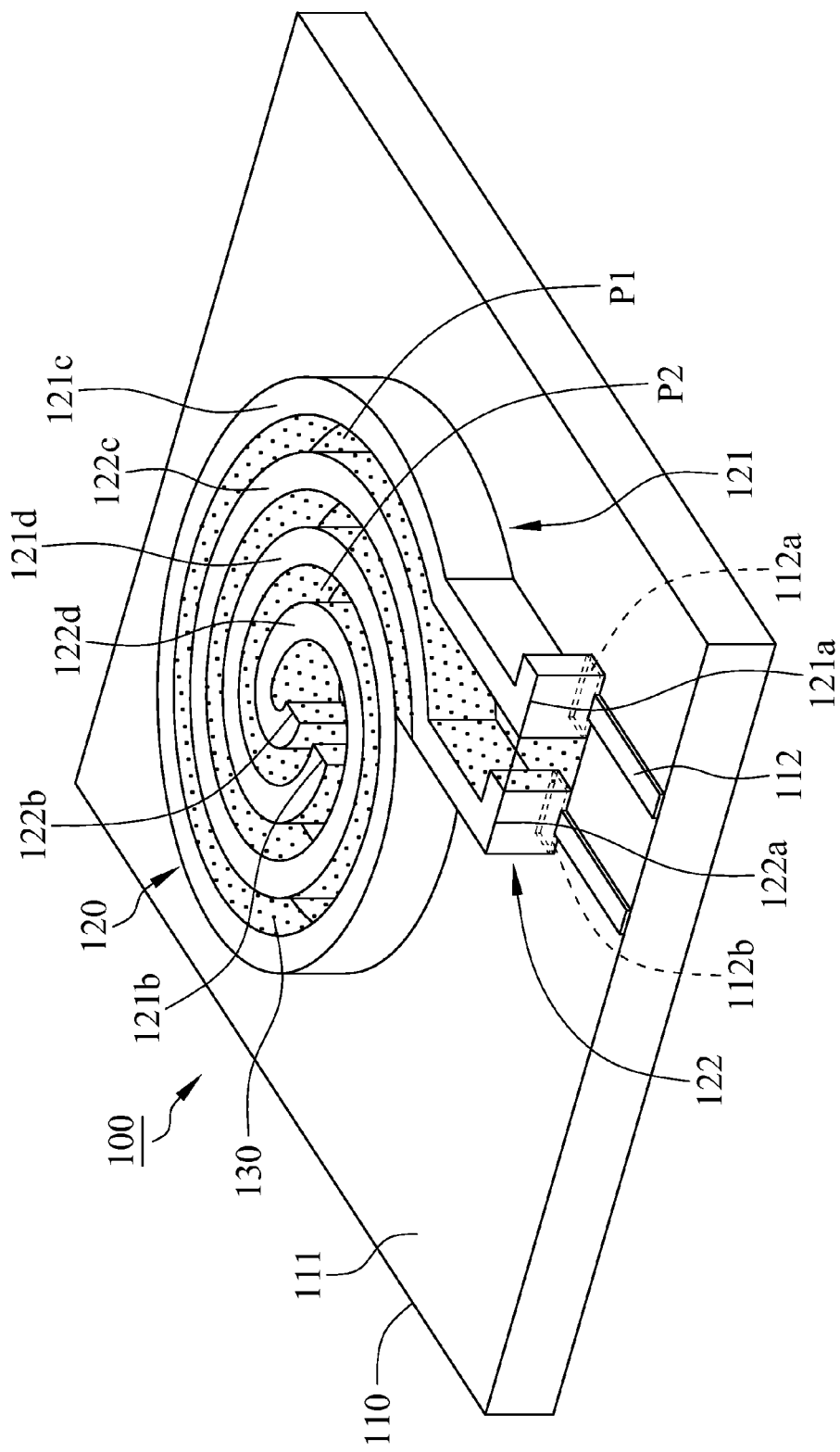
FIG. 2 is a perspective diagram illustrating another carrier with three-dimensional capacitor in accordance with a second embodiment of the present invention.

The carrier with three-dimensional capacitor 100 in accordance with the second embodiment of the present invention is illustrated in FIG. 2. The carrier with three-dimensional capacitor 100 includes a substrate 110, at least one three-dimensional capacitor 120 and an insulating layer 130, wherein the substrate 110 comprises a surface 111 and at least one trace layer 112 having at least one first terminal 112a and at least one second terminal 112b. The three-dimensional capacitor 120 is integrally formed as one piece with the trace layer 112. Besides, the three-dimensional capacitor 120 and the trace layer 112 are made of the same material. The three-dimensional capacitor 120 comprises a first capacitance portion 121 and a second capacitance portion 122 having a polarity opposite to a polarity of the first capacitance portion 121. The three-dimensional capacitor 120 is spiral-shaped. The first capacitance portion 121 comprises a first end 121a, a second end 121b, at least one first section 121c, at least one second section 121d and at least one first passage P1. The second capacitance portion 122 is formed at the first passage P1 and comprises a third end 122a, a fourth end 122b, at least one third section 122c, at least one fourth section 122d and at least one second passage P2 communicated with the first passage P1. The primary difference between the second embodiment and the first embodiment is that the carrier with three-dimensional capacitor 100 further includes said insulating layer 130. The insulating layer 130 is formed at the first passage P1 and the second passage P2 to replace the air. The insulating layer 130 is spiral-shaped. The material of the insulating layer 130 is selected from one of Polyimide, Benzocyclobutene, ink, molding compound and underfill. In this embodiment, the three-dimensional capacitor 120 and the trace layer 112 are integrally formed as one piece via redistribution layer trace technology in semiconductor process. For the insulating layer 130 with different material having different dielectric constant, the material of the insulating layer 130 can be selected upon desired capacitance.

Figure 3:
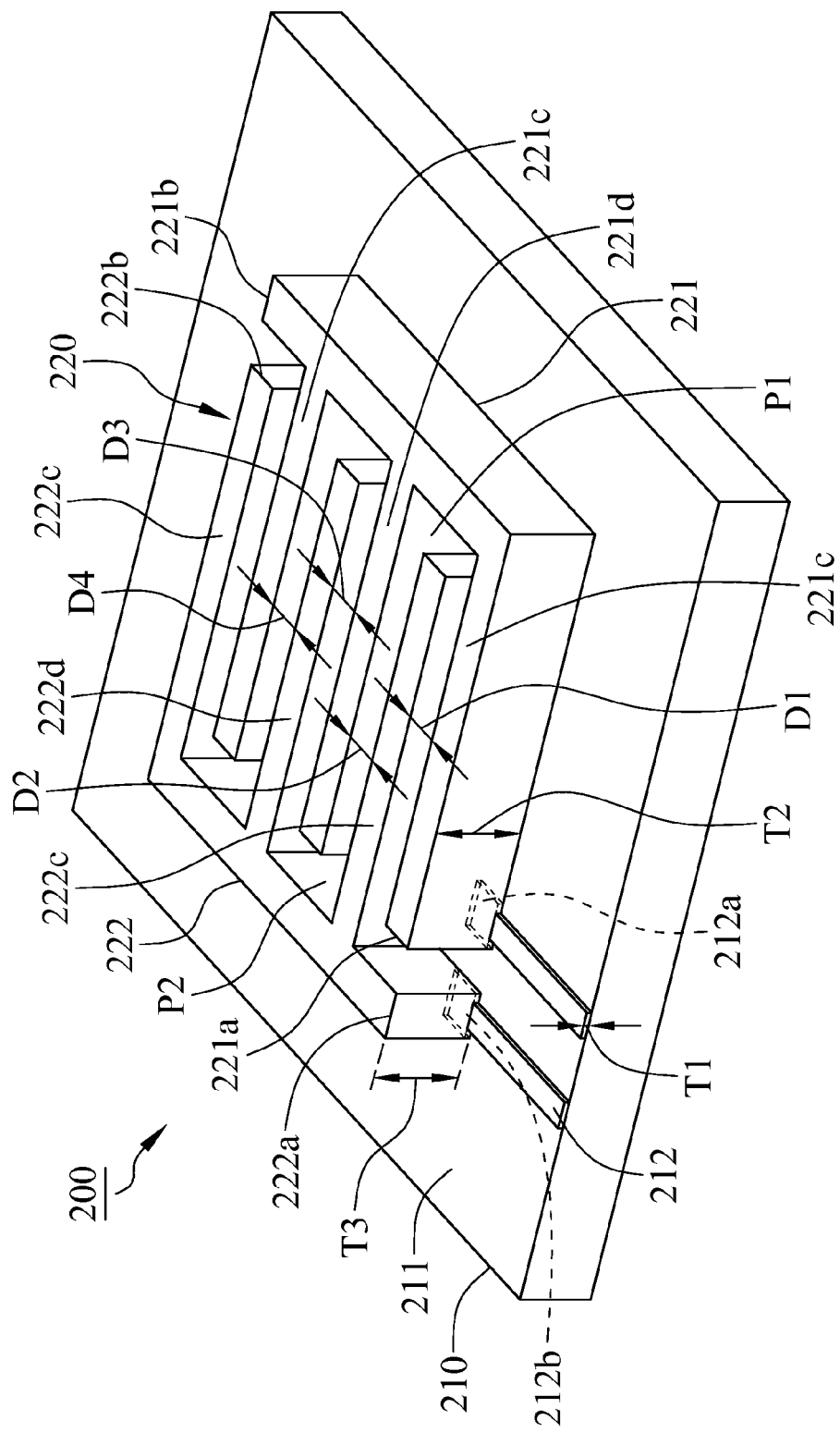
FIG. 3 is a perspective diagram illustrating another carrier with three-dimensional capacitor in accordance with a third embodiment of the present invention.

The carrier with three-dimensional capacitor 200 in accordance with the third embodiment of the present invention is illustrated in FIG. 3. The carrier with three-dimensional capacitor 200 includes a substrate 210 and at least one three-dimensional capacitor 220, wherein the substrate 210 comprises a surface 211 and at least one trace layer 212 formed on the surface 211. In this embodiment, the material of the trace layer 212 is copper, and the 212 comprises at least one first terminal 212a and at least one second terminal 212b. The three-dimensional capacitor 220 is integrally formed as one piece with the trace layer 212 of the substrate 210. Besides, the three-dimensional capacitor 220 and the trace layer 212 are made of the same material. The three-dimensional capacitor 220 comprises a first capacitance portion 221 and a second capacitance portion 222 having a polarity opposite to a polarity of the first capacitance portion 221. In this embodiment, the trace layer 212 comprises a first thickness T1, the first capacitance portion 221 comprises a second thickness T2, the second capacitance portion 222 comprises a third thickness T3, wherein the second thickness T2 and the third thickness T3 are not smaller than the first thickness T1. The second thickness T2 is the same as the third thickness T3. The first capacitance portion 221 comprises a first end 221a, a second end 221b, at least one first section 221c, at least one second section 221d connected to the first section 221c and at least one first passage P1 located between the first section 221c and the second section 221d. In this embodiment, the first end 221a is located at the first section 221c. The second capacitance portion 222 is formed at the first passage P1 and comprises a third end 222a, a fourth end 222b, at least one third section 222c, at least one fourth section 222d connected to the first section 222c and at least one second passage P2 located between the third section 222c and the fourth section 222d. The second passage P2 is in communication with the first passage P1. The third end 222a is located at the third section 222c. The first capacitance portion 221 is located at the second passage P2, the first end 221a corresponds to the third end 222a, the second end 221b corresponds to the fourth end 222b, the first end 221a is in connection with the first terminal 212a, and the third end 222a is in connection with the second terminal 212b. The first section 221c and the third section 222c are spaced apart from each other to define a first spacing D1, the third section 222c and the second section 221 d are spaced apart from each other to define a second spacing D2 equal to the first spacing D1, the fourth section 222d and the second section 221 d are spaced apart from each other to define a third spacing D3 equal to the first spacing D1. The first section 221 c and the fourth section 222d are spaced apart from each other to define a fourth spacing D4 equal to the third spacing D3. Accordingly, the first spacing D1, the second spacing D2, the third spacing D3 and the fourth spacing D4 are all the same. In this embodiment, the primary difference between the third embodiment and the first embodiment is that the three-dimensional capacitor 220 is comb-shaped.

Figure 4:
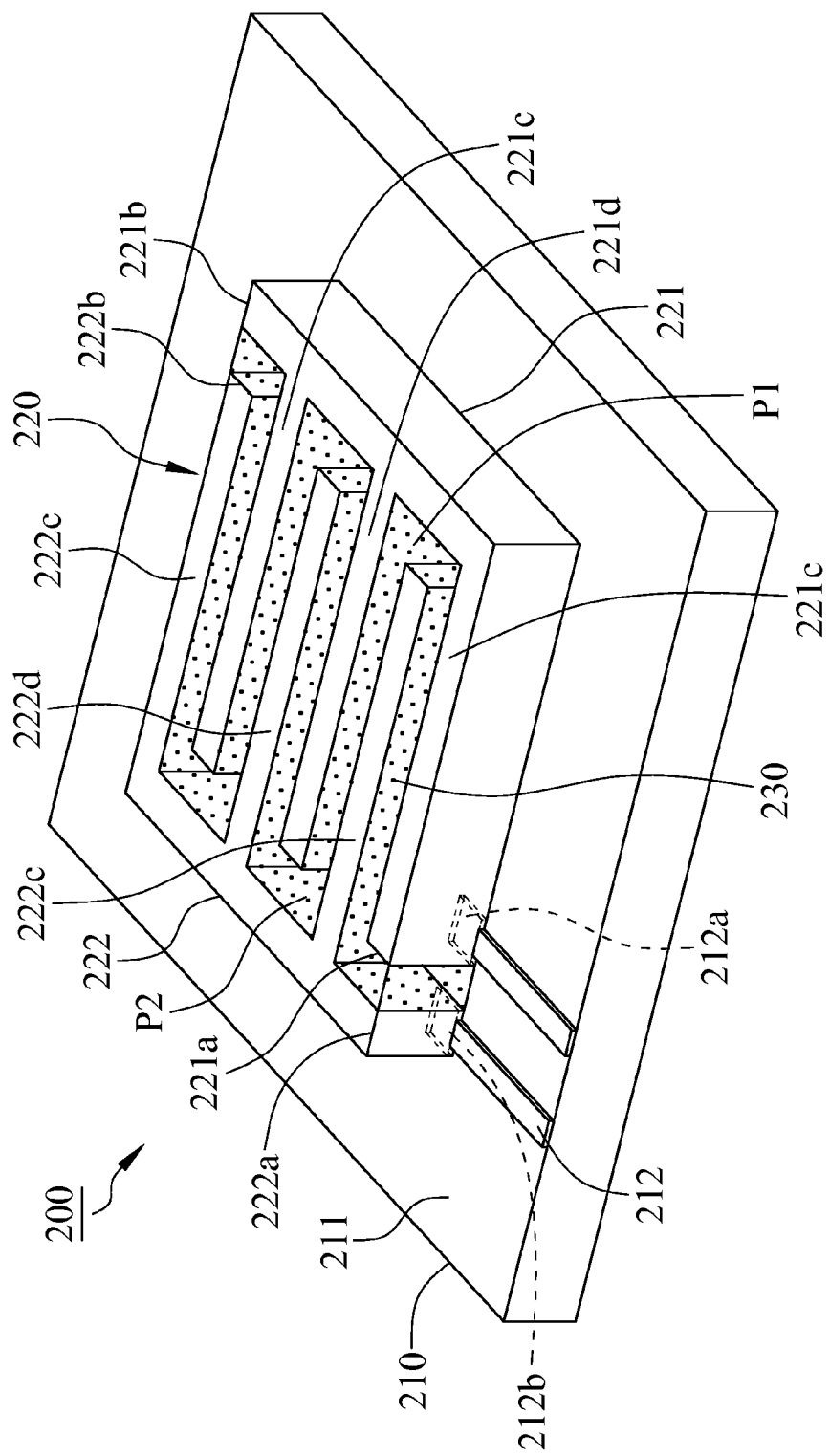
FIG. 4 is a perspective diagram illustrating another carrier with three-dimensional capacitor in accordance with a fourth embodiment of the present invention.

The carrier with three-dimensional capacitor 200 in accordance with the fourth embodiment of the present invention is illustrated in FIG. 4. The carrier with three-dimensional capacitor 200 includes a substrate 210, at least one three-dimensional capacitor 220 and an insulating layer 230, wherein the substrate 210 comprises a surface 211 and at least one trace layer 212 having at least one first terminal 212a and at least one second terminal 212b. The three-dimensional capacitor 220 is integrally formed as one piece with the trace layer 212 of the substrate 210. Besides, the three-dimensional capacitor 220 and the trace layer 212 are made of the same material. The three-dimensional capacitor 220 comprises a first capacitance portion 221 and a second capacitance portion 222 having a polarity opposite to a polarity of the first capacitance portion 221. In this embodiment, the three-dimensional capacitor 220 is comb-shaped. The first capacitance portion 221 comprises a first end 221a, a second end 221b, at least one first section 221c, at least one second section 221d and at least one first passage P1. The second capacitance portion 222 is formed at the first passage P1 and comprises a third end 222a, a fourth end 222b, at least one third section 222c, at least one fourth section 222d and at least one second passage P2 communicated with the first passage P1. The first capacitance portion 221 is located at the second passage P2, the first end 221a corresponds to the third end 222a and connects to the first terminal 212a, the second end 221b corresponds to the fourth end 222b, and the third end 222a is in connection with the second terminal 212b. The primary difference between the fourth embodiment and the first embodiment is that the carrier with three-dimensional capacitor 200 further includes said insulating layer 230. The insulating layer 230 is formed at the first passage P1 and the second passage P2. Besides, the insulating layer 230 is S-shaped. The material of the insulating layer 230 is selected from one of Polyimide, Benzocyclobutene, ink, molding compound and underfill.

Referring to FIGS. 1, 2, 3 and 4, the three-dimensional capacitor 120, 220 and the trace layer 112, 212 are integrally formed as one piece via redistribution layer trace technology. Besides, the three-dimensional capacitor 120, 220 is composed of two adjacent metals with opposite polarity to each other and the air between adjacent metals. By means of features mentioned above, the production line and package costs for surface-mounting passive devices can be ignored, derivatively, a current leakage caused by massively increased parasite capacitances and point defects will not be troubled in the present invention therefore substantially raising yield rate and lowering measurement costs.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A carrier with three-dimensional capacitor at least includes:
    a substrate having a surface and at least one trace layer formed on the surface, the at least one trace layer comprises at least one first terminal and at least one second terminal; and
    at least one three-dimensional capacitor integrally formed as one piece with the at least one trace layer, wherein the at least one three-dimensional capacitor and the at least one trace layer are made of a same material, the at least one three-dimensional capacitor comprises a first capacitance portion and a second capacitance portion having a polarity opposite to a polarity of the first capacitance portion, the first capacitance portion comprises a first end, a second end, at least one first section, at least one second section connected to the at least one first section and at least one first passage located between the at least one first section and the at least one second section, the second capacitance portion is formed at the at least one first passage and comprises a third end, a fourth end, at least one third section, at least one fourth section connected to the at least one third section and at least one second passage located between the at least one third section and the at least one fourth section, the at least one second passage is in communication with the at least one first passage, the first capacitance portion is located at the second passage, the first end corresponds to the third end and connects to the at least one first terminal, the third end connects to the at least one second terminal, wherein the at least one first section and the at least one third section are spaced apart from each other to define a first spacing, the at least one third section and the at least one second section are spaced apart from each other to define a second spacing, the at least one fourth section and the at least one second section are spaced apart from each other to define a third spacing.

2. The carrier with three-dimensional capacitor in accordance with claim 1, wherein the first spacing is equal to the second spacing.

3. The carrier with three-dimensional capacitor in accordance with claim 1 further includes an insulating layer formed at the at least one first passage and the at least one second passage, wherein the insulating layer is spiral-shaped.

4. The carrier with three-dimensional capacitor in accordance with claim 1 further includes an insulating layer formed at the at least one first passage and the at least one second passage, wherein the insulating layer is S-shaped.

5. The carrier with three-dimensional capacitor in accordance with claim 1, wherein the at least one trace layer comprises a first thickness, the first capacitance portion comprises a second thickness, the second capacitance portion comprises a third thickness, the second thickness and the third thickness are not smaller than the first thickness.

6. The carrier with three-dimensional capacitor in accordance with claim 1, wherein the at least one three-dimensional capacitor is comb-shaped.

7. The carrier with three-dimensional capacitor in accordance with claim 1, wherein the at least one three-dimensional capacitor is spiral-shaped.

8. The carrier with three-dimensional capacitor in accordance with claim 5, wherein the second thickness is the same as the third thickness.

9. The carrier with three-dimensional capacitor in accordance with claim 1, wherein the at least one first section and the at least one fourth section are spaced apart from each other to define a fourth spacing equal to the third spacing.

10. The carrier with three-dimensional capacitor in accordance with claim 1, wherein the third spacing is equal to the first spacing.

11. The carrier with three-dimensional capacitor in accordance with claim 1, wherein the material of the at least one trace layer is copper.

12. The carrier with three-dimensional capacitor in accordance with claim 3, wherein the material of the insulating layer is selected from one of Polyimide, Benzocyclobutene, ink, molding compound and underfill.

13. The carrier with three-dimensional capacitor in accordance with claim 4, wherein the material of the insulating layer is selected from one of Polyimide, Benzocyclobutene, ink, molding compound and underfill.

* * * * *